(12) United States Patent
Bessonov et al.

(10) Patent No.: US 10,520,340 B2
(45) Date of Patent: Dec. 31, 2019

(54) SENSING SYSTEM, METHOD AND APPARATUS

(71) Applicant: LytEn, Inc., Sunnyvale, CA (US)

(72) Inventors: Alexander Alexanadrovich Bessonov, Moscow (RU); Ilya Borisovich Gartseev, Moscow (RU); Marina Nikolaevna Kirikova, Moscow (RU)

(73) Assignee: Lyten, Inc., Sunnyvale, CA (US)

( * ) Notice: Subject to any disclaimer, the term of this patent is extended or adjusted under 35 U.S.C. 154(b) by 354 days.

(21) Appl. No.: 15/521,781

(22) PCT Filed: Oct. 27, 2014

(86) PCT No.: PCT/RU2014/000809
§ 371 (c)(1),
(2) Date: Apr. 25, 2017

(87) PCT Pub. No.: WO2016/068739
PCT Pub. Date: May 6, 2016

(65) Prior Publication Data
US 2017/0261355 A1     Sep. 14, 2017

(51) Int. Cl.
*G01D 21/00*     (2006.01)
*H01L 45/00*     (2006.01)

(52) U.S. Cl.
CPC .............. *G01D 21/00* (2013.01); *H01L 45/04* (2013.01)

(58) Field of Classification Search
CPC ................................ G01D 21/00; H01L 45/04
See application file for complete search history.

(56) References Cited

U.S. PATENT DOCUMENTS

| 7,155,281 B1 | 12/2006 | Fayram |
| 2003/0154776 A1 | 8/2003 | Naik |

(Continued)

FOREIGN PATENT DOCUMENTS

| DE | 10 2012 200267 | 7/2013 |
| WO | 2012/156126 A2 | 11/2012 |
| WO | 2013/039468 A1 | 3/2013 |

OTHER PUBLICATIONS

International Search Report and Written Opinion received for corresponding Patent Cooperation Treaty Application No. PCT/RU2014/000809, dated Jul. 6, 2015, 11 pages.

(Continued)

*Primary Examiner* — David Z Huang
(74) *Attorney, Agent, or Firm* — Dinsmore & Shohl LLP

(57) ABSTRACT

In accordance with an example embodiment of the present invention, a system is disclosed. The system comprises a first sensing unit (11) adapted to detect change in a parameter and produce an electrical signal (12) based on the detection; and a memristive unit (13) electrically coupled to the first sensing unit (11), wherein the memristive unit (13) is adapted to switch between a first and a second states based on the electrical signal (12) produced by the first sensing unit (11), wherein the resistance value of the memristive unit (13) in the first state is lower than the resistance value of the memristive unit (13) in the second state. The system further comprises at least one additional sensing unit (14) electrically coupled to the memristive unit (13), wherein the at least one additional sensing unit (14) is adapted to stand by when the memristive unit (13) is in the second state, and perform measurement of a parameter when the memristive unit (13) is in the first state. A method (21-26) and apparatus for sensing parameters are also disclosed.

18 Claims, 5 Drawing Sheets

(56) References Cited

U.S. PATENT DOCUMENTS

| | | |
|---|---|---|
| 2005/0241402 A1 | 11/2005 | Nienhaus |
| 2010/0141417 A1 | 6/2010 | Boes |
| 2012/0014169 A1 | 1/2012 | Snider |
| 2012/0090757 A1 | 4/2012 | Buchan et al. |
| 2013/0223134 A1 | 8/2013 | Yi et al. |
| 2013/0265285 A1 | 10/2013 | Piccolotto et al. |
| 2017/0248442 A1* | 8/2017 | Gartseev ................ G01D 1/04 |

OTHER PUBLICATIONS

Pazienza et al., "Memristor as an Archetype of Dynamic Data-Driven Systems and Applications to Sensor Networks", Procedia Computer Science, vol. 4, 2011, pp. 1782-1787.

MERKEL, "Thermal Profiling in CMOS/Memristor HybridArchitectures", Thesis, May 1, 2011, 95 pages.

* cited by examiner

SENSING SYSTEM, METHOD AND APPARATUS

RELATED APPLICATION

This application was originally filed as PCT Application No. PCT/RU2014/000809 filed Oct. 27, 2014.

TECHNICAL FIELD

The present application relates to microelectronics. In particular, the present application relates to sensors and sensor arrays.

BACKGROUND OF THE INVENTION

Sensors are used in everyday objects as well as implementations of which most people are not aware. With advances in electronics, the uses of sensors have expanded beyond the more traditional fields of temperature, pressure or flow measurement, for example into MARG (magnetic angular rate gravity) and other sensors. Analog sensors such as potentiometers and force-sensing resistors are still widely used. Applications of sensors include, among others, technical devices and electronic devices.

SUMMARY

In this section, the main embodiments of the present invention as defined in the claims are described and certain definitions are given.

According to an aspect of the present invention, a system is disclosed. The system comprises: a first sensing unit adapted to detect change in a parameter and produce an electrical signal based on the detection; a memristive unit electrically coupled to the first sensing unit, wherein the memristive unit is adapted to switch between a first and a second states based on the electrical signal produced by the first sensing unit, wherein the resistance value of the memristive unit in the first state is lower than the resistance value of the memristive unit in the second state; and at least one additional sensing unit electrically coupled to the memristive unit, wherein the at least one additional sensing unit is adapted to stand by when the memristive unit is in the second state, and perform measurement of a parameter when the memristive unit is in the first state.

The system may be, for example, a sensing system, or a system for measuring parameters. The sensing units can perform the detection and measurement, for example, by reacting to one or more parameters, or changes in the parameters, of the environment in which the sensing unit is placed. The detection may be continuous.

By memristive unit is meant a unit which has memristive properties. This refers, for example, to a unit comprising any memristor. The first state may be a lower resistance state, and the second state may be a higher resistance state. The difference in the resistance values of the first and second states of the memristive unit may of any range, as long as the relative resistance of the states is different.

In an embodiment, the processing unit may comprise, for example, a microprocessor and an analog digital converter.

According to an embodiment, the measured parameter is selected from the group of: mechanical deformations, temperature, humidity, magnetic field, luminance, ambient light, ultra-violet or infra-red light, flow of gas or liquid, chemical and biological parameters.

According to an embodiment, the memristive unit is adapted to switch to the first state when the current value of the electrical signal produced by the first sensing unit is above a threshold value, and adapted to decay to the second state if the current value of said electrical signal is below the threshold value or if the polarity of said electrical signal changes to the opposite.

According to an embodiment, the memristive unit comprises a material selected from the group of: metal oxides and chalcogenides. In an embodiment, the material may also be selected from halides, nitrides and organic polymers.

According to an embodiment, the first sensing unit and the at least one additional sensing unit are electrically coupled to the memristive unit in parallel.

According to an embodiment, the system further comprising a processing unit electrically coupled to the memristive unit.

According to an embodiment, the at least one additional sensing unit and/or the first sensing unit is electrically coupled to the processing unit, and the at least one additional sensing unit and/or the first sensing unit is further adapted to produce an electrical signal based on the measurement. In the embodiment, the processing unit is adapted to receive and digitize the electrical signal produced by the at least one additional sensing unit and/or the first sensing unit.

According to an embodiment, the processing unit is adapted to send a termination signal to the memristive unit; and the memristive unit is adapted to receive the termination signal from the processing unit and switch to a higher resistance state upon receiving said signal.

In an embodiment, the first sensing unit, the memristive unit and the at least one additional sensing unit form a single device. In an alternative embodiment, the first sensing unit, the memristive unit and the at least one additional sensing unit are separate devices.

According to an embodiment, the system further comprises a power supply unit electrically coupled to the first sensing unit, wherein the power supply unit is adapted to provide power to the first sensing unit. The power supply unit may also be adapted to provide power to other units.

The system according to any of the above embodiments may be used as part of a sensor array.

According to an aspect of the present invention, a method is disclosed. The method comprises: detecting change in a parameter by a first sensing component; producing an electrical signal based on the detection; providing the electrical signal to a memristive component; switching the memristive component to a first or a second state based on the provided electrical signal produced by the first sensing component, wherein the resistance value of the memristive component in the first state is lower than the resistance value of the memristive component in the second state; starting measurement of a parameter by at least one additional sensing component when the memristive component switches to the first state; and terminating measurement of a parameter by the at least one additional sensing component when the memristive component switches to the second state.

The method may be, but not limited to, a method for sensing of a parameter. Detecting change in a parameter may be performed continuously. Switching to the first state may be done when the current value of the electrical signal reaches a threshold level.

According to an embodiment, the method further comprises producing an electrical signal by the at least one additional sensing component based on the measurement of a parameter; providing the electrical signal produced by the at least one sensing component to a processing component, and digitizing the provided electrical signal by the processing component.

According to an embodiment, the method further comprises sending a termination signal from the processing component to the memristive component, and switching the memristive component to a higher resistance state when the termination signal is received from the processing component.

The method according to the above embodiment can be used in an electronic device.

According to a third aspect of the present invention, an apparatus is disclosed. The apparatus comprises: at least one processor; at least one memory coupled to the at least one processor, the at least one memory comprising program code instructions which, when executed by the at least one processor, cause the apparatus to perform the methods according to any of the abovementioned embodiments.

The apparatus may be, for example, a sensing apparatus.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE EMBODIMENTS

Figure 1A:
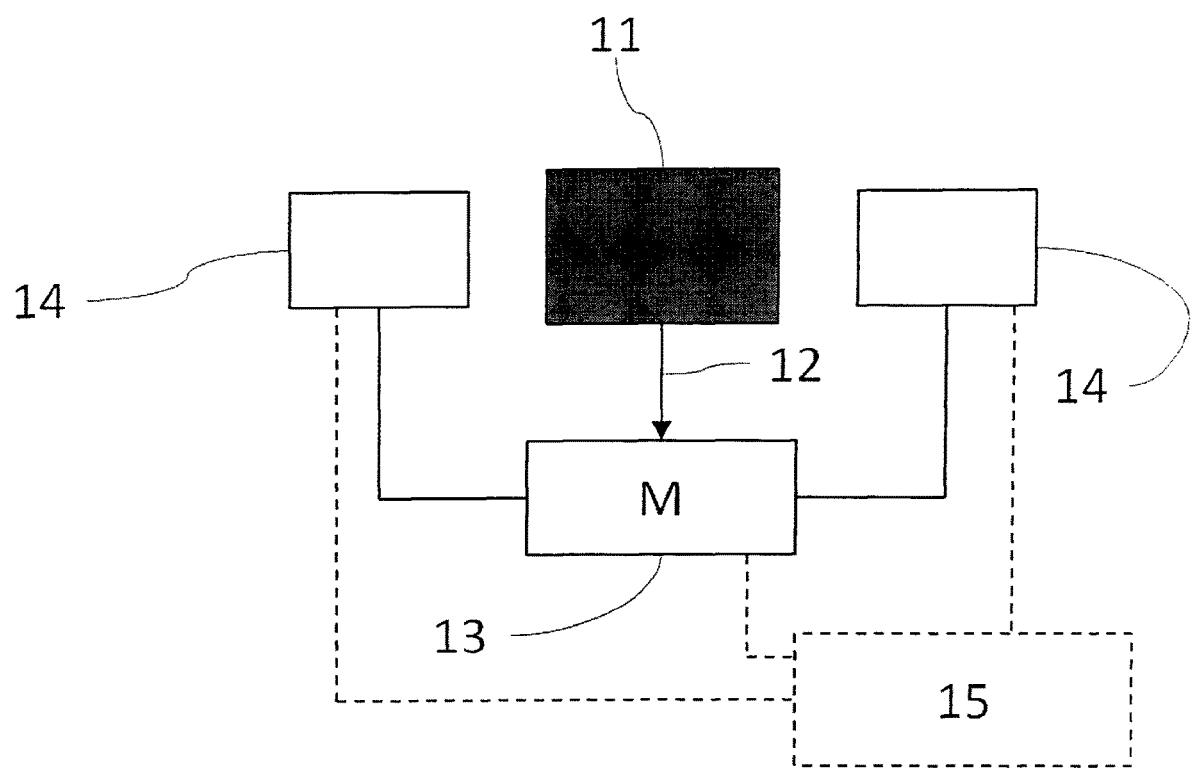
FIG. 1a shows a systems according to an embodiment.
Figure 1B:
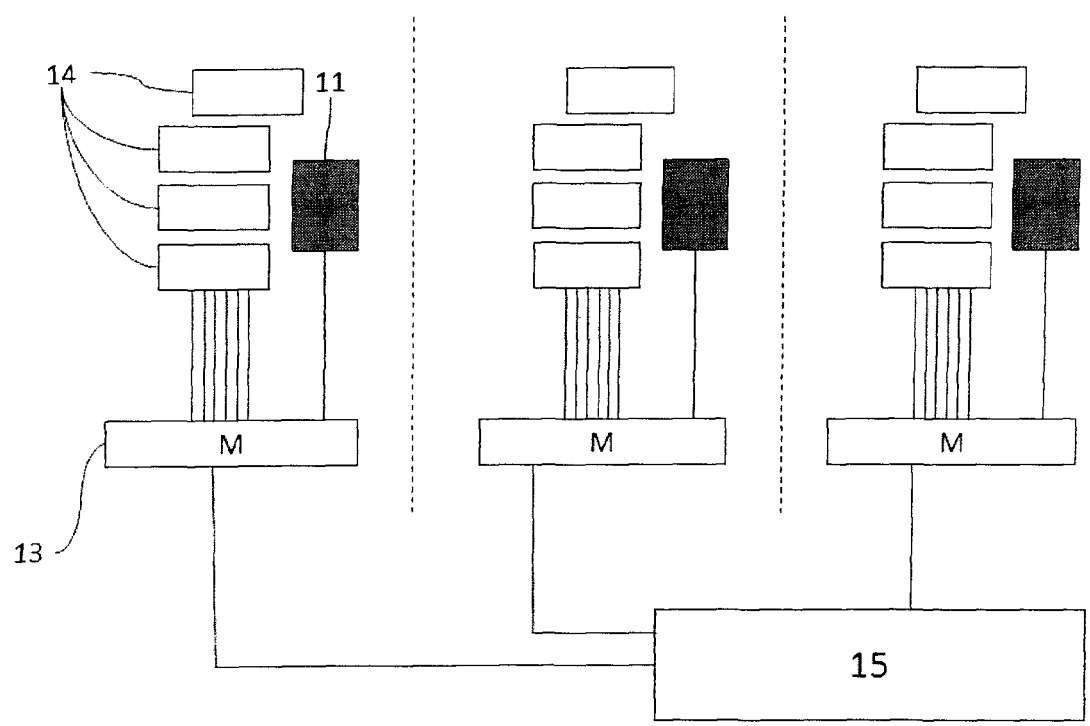
FIG. 1b shows a sensor array comprising a system according to an embodiment.
Figure 2:
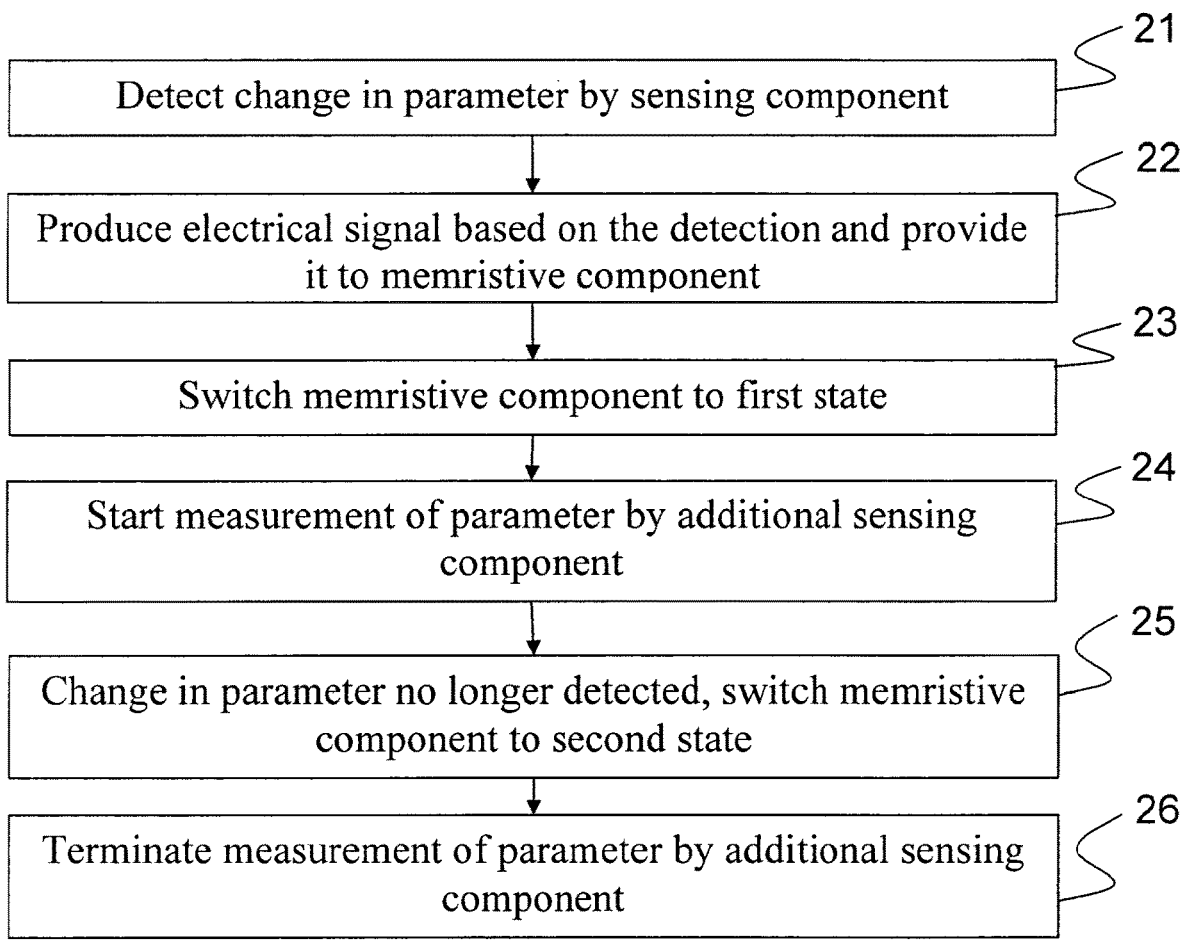
FIG. 2 shows a method according to an embodiment.
Figure 3:
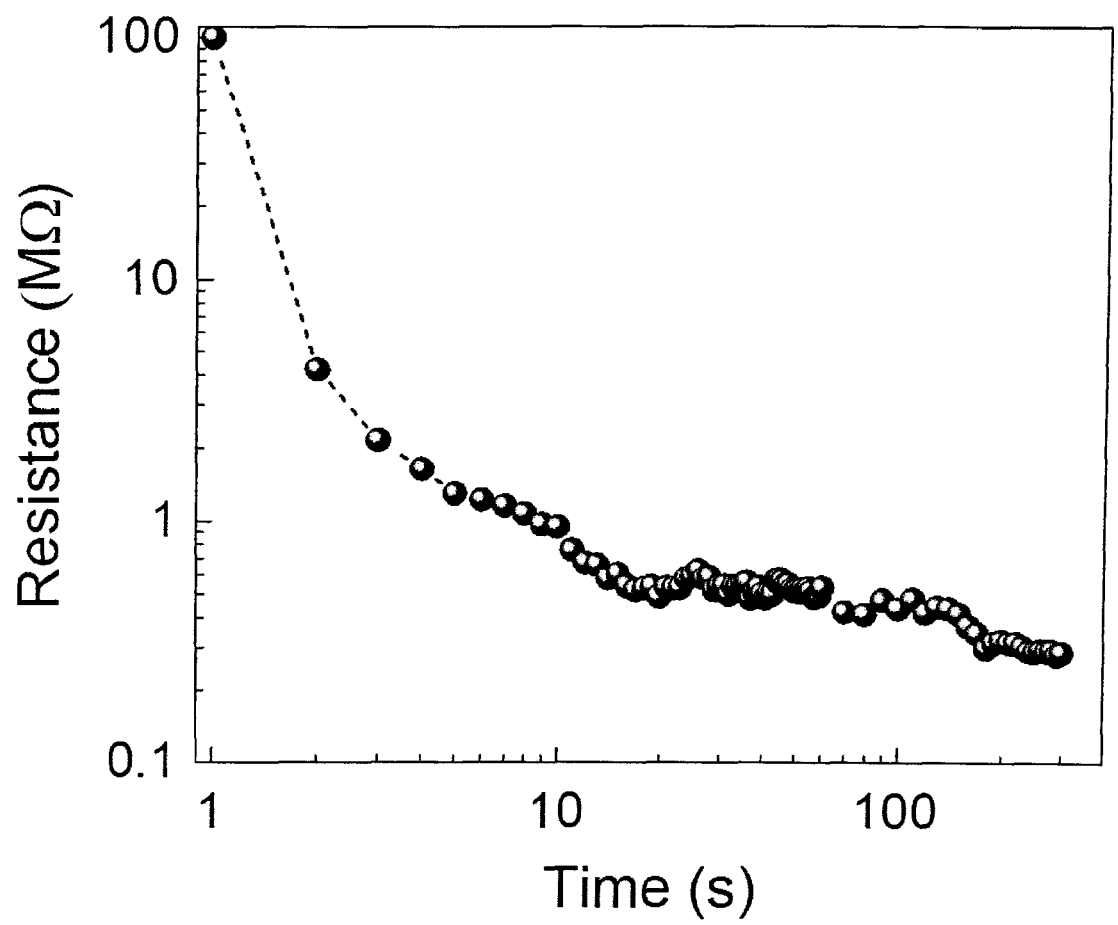
FIG. 3 is a graph that shows decrease in resistance of a memristor coupled to a strain sensor with repeated bending stimulation.

Exemplary embodiments of the present invention and its potential advantages are understood by referring to FIGS. 1 through 3 of the drawings. The present invention relates to a system, method and apparatus for parameter sensing.

FIG. 1 shows a system according to an embodiment of the present invention. It is clear to a skilled person that the system shown in this and any of the following figures is an exemplary implementation of the present invention, and the claimed system is not limited to the structure shown herein. The system comprises a first sensing unit 11 which detects change in a parameter. The first sensing unit 11 may be, for example, an active sensor that is connected to an external power source (not shown on FIG. 1), adapted to continuously monitor changes in a parameter. The parameter 12 may be mechanical deformations such as pressure, touch and strain; temperature changes caused, for example, by touch, breathing, or environmental factors; humidity fluctuations caused by touch, breathing or environmental factors; magnetic field; luminance, ambient light, ultra-violet or infra-red light; flow of gas or liquid; chemical and biological parameters or other parameters. The detection can be performed continuously or discretely with a predetermined frequency.

The first sensing unit 11 is also adapted to produce an electrical signal 12 which is based on the detection. In other words, the sensing unit 11 detects a change in the parameter and converts this reaction into an electrical signal 12. The sensing unit 11 may comprise, for example, an analog sensor device that converts a physical, chemical or biological parameter into an output electrical signal of certain current and voltage. The sensor may be a resistive or optionally capacitive type sensor.

The system further comprises a memristive unit 13 which is electrically coupled to the first sensing unit 11 and is adapted to receive the produced electrical signal 12. The memristive unit 13 may comprise a material selected from the group of: metal oxides, halides, nitrides, chalcogenides and organic polymers. The memristive unit may comprise a bipolar memristor. The memristive unit 13 is adapted to switch between a first and a second state based on the electrical signal 12 received from the first sensing unit 11. In the first state the resistance value of the memristive unit 13 is lower than that of the memristive unit 13 in the second state. For clarity purposes only, hereinafter the first and second states will be referred to as the lower resistance state and the higher resistance state, correspondingly. In an exemplary embodiment, the memristive unit 13 may switch to the lower resistance state when the current value of the electric signal 12 reaches and exceeds a certain threshold value. For example, if the sensing unit 11 detects sufficient change in a parameter, the unit 11 produces an electrical signal 12 having amperage above a threshold value which causes the memristive unit 13 to switch to the lower resistance state. The memristive unit may also switch back to the higher resistance state when the current value of the electrical signal 12 drops down below the threshold value or when the signal 12 changes polarity, or it may decay back to the higher resistance state after a period of time. This period may depend on the memristive unit 13 properties such as the materials it comprises and the switching mechanism it supports.

The system also comprises at least one additional sensing unit 14. For exemplary purposes only, the system shown on FIG. 1b has two additional sensing units 14. The additional sensing units 14 are electrically coupled to the memristive unit 13. The additional sensing units 14 may comprise, for example, analog sensor devices that convert a physical, chemical or biological parameter into an output electrical signal of certain current and voltage. The sensors may be of a resistive or capacitive type.

The additional sensing units 14 stand by when the memristive unit 13 is in the higher resistance state, and perform measurement of a parameter when the memristive unit 13 is in the lower resistance state, for example, because with a lower resistance of the memristive unit 13 a higher value current passes through the circuit. In other words, since the states of the memristive unit 13 are controlled by the electric signal 12 sent from the first sensing unit 11, activation of the additional sensing units 14 is also controlled by the signal 12. In an example embodiment of the invention, when the parameter monitored by the first sensing unit 11 starts changing, the first sensing unit 11 detects this change and "switches on" the additional sensing units 14 via the memristive unit 13.

The parameters detected by the first sensing unit 11 and measured by the additional sensing units 14 may be the same parameter or different parameters.

The system may also optionally comprise a processing unit 15 shown by dashed lines. The processing unit 15 can be electrically coupled to the memristive unit 13 and the additional sensing units 14. In an embodiment, the additional sensing units 14 are adapted to produce an electrical signal based on the measurement of a parameter. In an embodiment, the first sensing unit 11 performs measurement of the parameter in addition to the detection. This measurement may also be transformed into an electrical signal. The electrical signals based on the measurement of a parameter can then be received and digitized by the processing unit 15. The processing unit 15 may comprise an Analog-Digital Converter (ADC) which digitizes the received electrical signals. The processing unit 15 may also comprise a memory which stores the digitized value, as well as a microprocessor, a microcontroller, or a programmable logic array.

In an exemplary embodiment, the processing unit 15 may send a termination signal to the memristive unit 13, wherein the memristive unit 13 is adapted to receive the termination signal from the processing unit 15 and switch to the higher resistance state upon receiving said signal. This "terminates" measurement performed by the additional sensing units 14. The termination signal may be needed because the decay times of some memristive units 13 can be, for example, too long and an earlier termination of the additional sensing units 14 is desired. The termination signal may be, for example, a single electric pulse with a predetermined voltage polarity, amplitude, and pulse duration, or a series of electric pulses with programmed frequency and number of pulses.

FIG. 1b shows a sensor array in which the system according to an embodiment of the invention is used as a component. The mentioned components are schematically separated by dashed lines. The sensor array may be a self-switching sensor array. In this example embodiment, each component has an active sensing unit 11 and four "passive" additional sensing units 14. The additional sensing units are electrically coupled to the corresponding memristive units 13, as schematically shown by connection lines. In this embodiment, the sensor array has a processing unit 15 which is connected to multiple components (systems). As mentioned above, the processing unit may be connected to the memristive units 13 and to the sensing units 11 and 14 (connection not shown).

In the embodiments described above, the sensing units 11 and 14 may be connected to the processing unit 15 in parallel. The memristive unit 13 may be a passive circuit element with no power gain, while at least the first sensing unit 11 may be an active circuit element which can amplify the signal passed through it. The system may be fully solution-processed and printed on rigid substrates or flexible plastic foils using a number of suitable wet-coating methods and printing techniques. The sensing units 11, 14 may be manufactured from any suitable materials such as thin films, organic polymers, nanocomposites, nanowires, metal nanoparticles, low-dimensional materials and others. Wiring can be realized by printing metal nanoparticle inks. Memristive units 13 can be fabricated using conventional deposition of metal oxides, halides, nitrides, chalcogenides, organic materials or by heterostructuring two-dimensional materials such as transition metal dichalcogenides and oxides. The first sensing unit 11 may have a higher sensitivity than the additional sensing units 14.

A technical effect of the above embodiments is economic power consumption of the system. This is because part (and possibly the majority) of the sensors is kept idle until a change in parameter is detected and signal is produced by the active sensor. A further technical effect of the system is the additional decay time before the memristor switches back to an "off" state. This time can be used for adjusting the interval between series of signal which can be measured by the additional sensors.

FIG. 2 is a schematic illustration of a method according to an embodiment. According to the method, detection of change in a parameter is performed at 21 by a first sensing component. The detection is then translated into an electrical signal, i.e. the signal is produced based on the detection. The electrical signal is provided to a memristive component, as indicated at 22. After this, if, for example, the current value of the electrical signal exceeds a threshold, the memristive component switches to a lower resistance state (first state) at 23. When the memristive component switches to the lower resistance state, the at least one additional sensing component starts measurement of a parameter at 24. The additional sensing components may also produce an electrical signal based on the measurement, and this electrical signal can be provided to a processing component and digitized by the same. When no further change in parameter is detected by the first sensing unit, the electrical signal may no longer be sent to the memristive component, or the current value of the produced signal can be below a threshold value. This results in switching the memristive component back to a higher resistance state (second state) 25. The switching can be done instantaneously or after a predetermined decay time of the memristive unit. After the memristive unit switches back to the higher resistance state at 25, measurement of parameter by the additional sensing components is terminated at 26.

The method may also include an optional step of switching the memristive component to a higher resistance state by the processing component, for example, by sending a termination signal.

The methods and systems according to the embodiments above may be used in electronic devices which can potentially benefit from power economical sensing. Examples of such devices include devices with sensing abilities such as: smartphones, wearables, fitness trackers, e-skin devices, e-nose devices, stand-alone sensors like monitors for temperature conditions, air cleanness etc. "Smart" house and car electronics may also take advantage of the methods and systems described above.

FIG. 3 is a graph of resistance against time for an exemplary strain sensing system in accordance with an embodiment. The system comprises a strain sensor as the first sensing unit and a $MoO_x/MoS_2$ memristor as the memristive unit, deposited on a plastic foil. The graph shows enhancement of the strain sensor signal through gradual decrease of resistance under cycled bending to 10 mm of the radius of curvature. When the strain sensor is bent inward under compression stress it generates electric pulses which are used to gradually set the state of the memristor. The strain sensor is connected with the memristive unit in series. The read DC voltage is 0.1 V.

Figure 4:
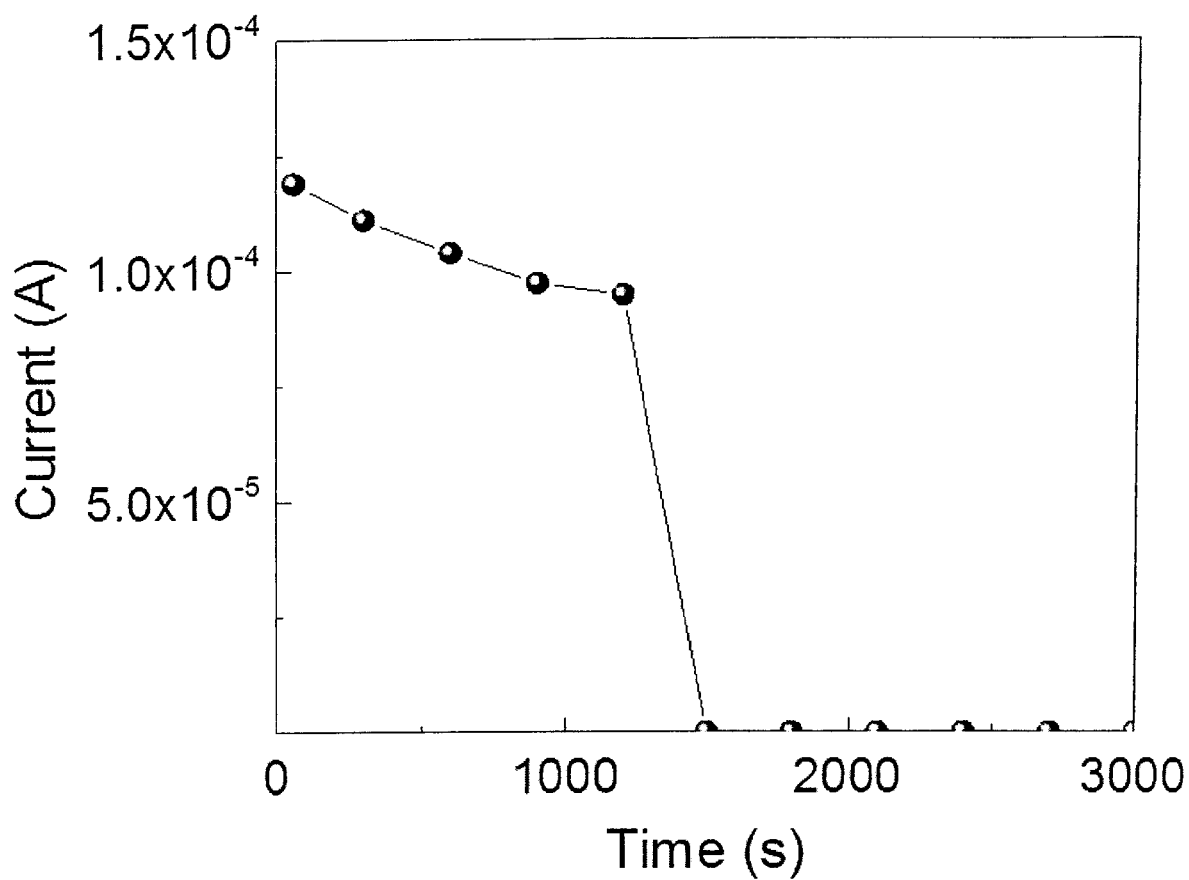
FIG. 4 is a graph that shows decay of memristor current.

FIG. 4 is a graph of current against time for an exemplary memristive unit that can be used in a system according to the above embodiments. The current values are recorded at +0.01 V bias after a positive voltage sweep up to 0.2 V. FIG. 4 shows decay of the memristor current indicating a transition from the lower resistance state to the higher resistance state.

An apparatus in accordance with the invention may include at least one processor in communication with a memory or memories. The processor may store, control, add and/or read information from the memory. The memory may comprise one or more computer programs which can be executed by the processor. The processor may also control the functioning of the apparatus. The processor may control other elements of the apparatus by effecting control signaling. The processor may, for example, be embodied as various means including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an application specific integrated circuit (ASIC), or field programmable gate array (FPGA), or some combination thereof. Signals sent and received by the processor may include any number of different wireline or wireless networking techniques.

The memory can include, for example, volatile memory, non-volatile memory, and/or the like. For example, volatile memory may include Random Access Memory (RAM), including dynamic and/or static RAM, on-chip or off-chip cache memory, and/or the like. Non-volatile memory, which may be embedded and/or removable, may include, for example, read-only memory, flash memory, magnetic storage devices, for example, hard disks, floppy disk drives, magnetic tape, etc., optical disc drives and/or media, non-volatile random access memory (NVRAM), and/or the like. If desired, the different functions discussed herein may be performed in a different order and/or concurrently with each other. Furthermore, if desired, one or more of the above-described functions may be optional or may be combined.

The abovementioned embodiments can provide the technical effect of precise sensing of a parameter due to a sufficiently large number of sensors while requiring only a fraction of the power that would be needed to support an array that has the same amount of active sensors.

The systems, methods and apparatuses according to embodiments of the present invention may be used in measuring electrical circuits of electronic devices, adaptive electronics, neuromorphic electronics, flexible electronics, printed electronics, and advanced electronic devices with multiple functions (such as e-skin and e-nose). The present invention can be used in devices which are required to function with limited power consumption.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. A system, comprising:
    a first sensing unit adapted to detect change in a parameter and produce an electrical signal based on the detection;
    a memristive unit electrically coupled to the first sensing unit, wherein the memristive unit is adapted to switch between a first and a second state based on the electrical signal produced by the first sensing unit, wherein the resistance value of the memristive unit in the first state is lower than the resistance value of the memristive unit in the second state; and
    at least one additional sensing unit electrically coupled to the memristive unit, wherein the at least one additional sensing unit is adapted to stand by when the memristive unit is in the second state, and perform measurement of the parameter when the memristive unit is in the first state.

2. The system of claim 1, wherein the parameter is selected from the group of: mechanical deformations, temperature, humidity, magnetic field, luminance, ambient light, ultra-violet or infra-red light, flow of gas or liquid, chemical and biological parameters.

3. The system of claim 1, wherein the memristive unit is adapted to switch to the first state when the current value of the electrical signal produced by the first sensing unit is above a threshold value, and decay to the second state if the current value of said electrical signal is below the threshold value or if the polarity of said electrical signal changes to opposite.

4. The system of claim 1, wherein the memristive unit comprises a material selected from the group of: metal oxides, and chalcogenides.

5. The system of claim 1, wherein the first sensing unit and the at least one additional sensing unit are electrically coupled to the memristive unit in parallel.

6. The system of claim 1, comprising a processing unit electrically coupled to the memristive unit.

7. The system of claim 6, wherein:
    the at least one additional sensing unit and/or the first sensing unit is electrically coupled to the processing unit,
    the at least one additional sensing unit and/or the first sensing unit is further adapted to produce an electrical signal based on the measurement, and
    the processing unit is adapted to receive and digitize the electrical signal produced by the at least one additional sensing unit and/or the first sensing unit.

8. The system of claim 6, wherein:
    the processing unit is adapted to send a termination signal to the memristive unit; and
    the memristive unit is adapted to receive the termination signal from the processing unit and switch to a higher resistance state upon receiving said signal.

9. The system of claim 1, wherein the first sensing unit, the memristive unit and the at least one additional sensing unit form a single device.

10. The system of claim 1, wherein the first sensing unit, the memristive unit and the at least one additional sensing unit are separate devices.

11. The system of claim 1, comprising a power supply unit electrically coupled to the first sensing unit, wherein the power supply unit is adapted to provide power to the first sensing unit.

12. The system of claim 1, wherein the first sensing unit is adapted to detect the change in the parameter continuously or discretely with a predetermined frequency.

13. A method, comprising:
    detecting change in a parameter by a first sensing component;
    producing an electrical signal by the first sensing component based on the detection;
    providing the electrical signal to a memristive component;
    switching the memristive component to a first or a second state based on the provided electrical signal produced by the first sensing component, wherein the resistance value of the memristive component in the first state is lower than the resistance value of the memristive component in the second state;
    starting measurement of the parameter by at least one additional sensing component when the memristive component switches to the first state; and
    terminating measurement of the parameter by the at least one additional sensing component when the memristive component switches to the second state.

14. The method of claim 13, wherein detecting the change in the parameter is performed continuously or discretely with a predetermined frequency.

15. The method of claim 13, wherein switching the memristive component to the first state is performed when a current value of the electrical signal produced by the first sensing component reaches a threshold level.

16. The method of claim 13, further comprising:
producing another electrical signal by the at least one additional sensing component based on the measurement of the parameter;
providing the electrical signal produced by the at least one sensing component to a processing component, and
digitizing the electrical signal produced by the at least one additional sending component by the processing component.

17. The method of claim 13, further comprising:
sending a termination signal from the processing component to the memristive component, and
switching the memristive component to the second state when the termination signal is received from the processing component.

18. An apparatus comprising
at least one processor;
at least one memory coupled to the at least one processor, the at least one memory comprising program code instructions which, when executed by the at least one processor, cause the apparatus to perform:
detecting change in a parameter by a first sensing component;
producing an electrical signal by the first sensing component based on the detection;
providing the electrical signal to a memristive component;
switching the memristive component to a first or a second state based on the provided electrical signal produced by the first sensing component, wherein the resistance value of the memristive component in the first state is lower than the resistance value of the memristive component in the second state;
starting measurement of the parameter by at least one additional sensing component when the memristive component switches to the first state; and
terminating measurement of the parameter by the at least one additional sensing component when the memristive component switches to the second state.

* * * * *